United States Patent [19]

Sasaki

[11] Patent Number: 5,039,873
[45] Date of Patent: Aug. 13, 1991

[54] MICROWAVE ELEMENTS WITH IMPEDANCE CONTROL CIRCUITS

[75] Inventor: Yoshinobu Sasaki, Itami, Japan

[73] Assignee: Mitsubishi Denki Kabushiki Kaisha, Japan

[21] Appl. No.: 497,306

[22] Filed: Mar. 22, 1990

[30] Foreign Application Priority Data

Jul. 18, 1989 [JP] Japan .................................. 1-185295

[51] Int. Cl.$^5$ ......................... H03K 5/00; H01P 1/10
[52] U.S. Cl. .................................... 307/262; 307/591;
307/570; 307/320; 333/104; 333/164; 330/277;
328/55; 328/155
[58] Field of Search .................. 328/55, 155; 307/511,
307/591, 592, 262, 570, 571, 579; 333/104, 103,
262, 164, 32, 124; 330/277

[56] References Cited

U.S. PATENT DOCUMENTS

| | | | |
|---|---|---|---|
| 3,882,431 | 5/1975 | Hopwood et al. | 307/320 |
| 4,430,630 | 2/1984 | Sakamoto | 307/320 |
| 4,789,846 | 12/1988 | Matsunaga et al. | 333/104 |

OTHER PUBLICATIONS

Matsunaga et al., "An X-Band 12W GaAs Monolithic Transmit-Receive Switch", IEICE, vol. E 70, No. 4, Apr., 1987.

*Primary Examiner*—Timothy P. Callahan
*Attorney, Agent, or Firm*—Leydig, Voit & Mayer

[57] ABSTRACT

A microwave element includes an impedance control circuit for controlling the capacitance between the source and the drain of an FET in the off state including a series-connected diode and capacitor connected in parallel between the source and drain of the FET and a circuit for applying a variable bias voltage to the diode. A microwave switch including two FETs includes two impedance control circuits for controlling the capacitances of the FETs. A microwave switched line phase shifter includes two transmission lines of different electrical lengths and four FETs, two of the FETs being connected in series at each of the ends of the two transmission lines. Impedance control circuits for controlling the capacitances of each of the FETs are included. A microwave loaded-line phase shifter includes a main transmission line, two loaded lines having the same electrical length connected to the respective ends of the main line, and impedance control circuits for controlling the capacitances of FETs connected between the loaded lines and ground.

4 Claims, 5 Drawing Sheets

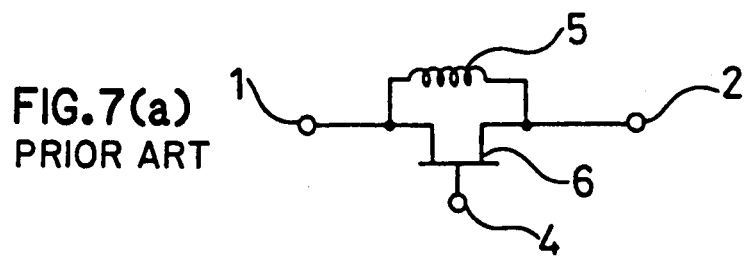
FIG.7(a) PRIOR ART
FIG.7(b) PRIOR ART
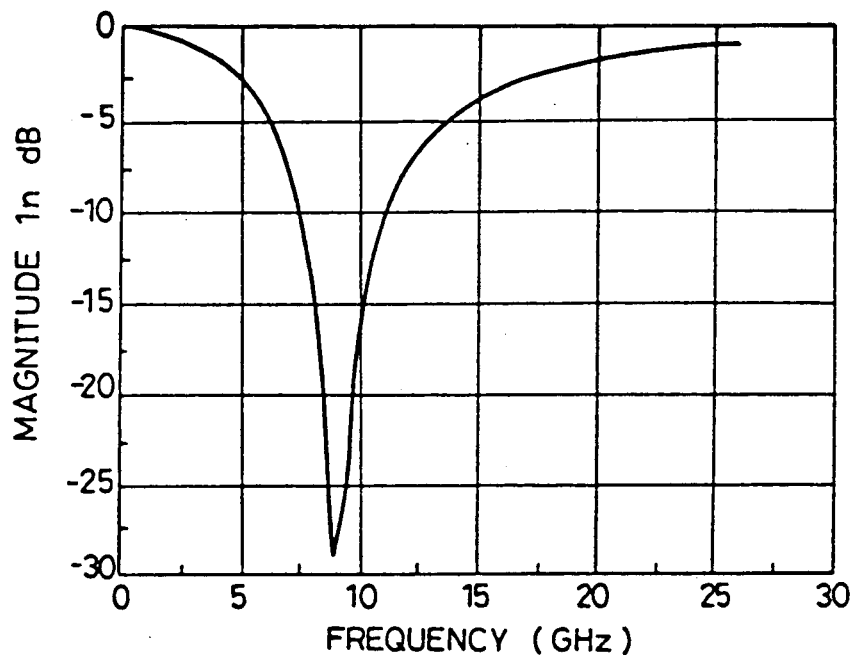
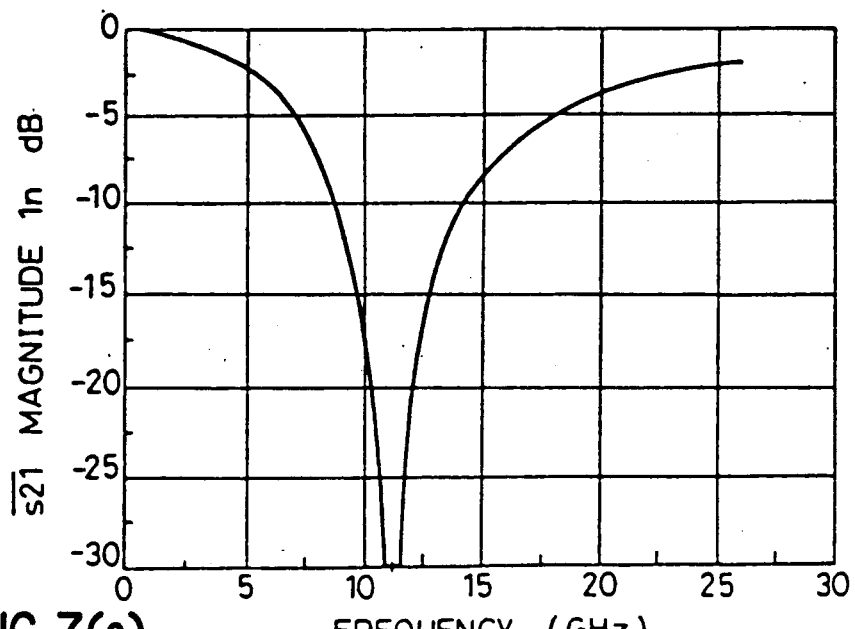
FIG.7(c) PRIOR ART

MICROWAVE ELEMENTS WITH IMPEDANCE CONTROL CIRCUITS

FIELD OF THE INVENTION

The present invention relates to microwave elements and, more particularly to control circuits utilized in a switch or a phase shifter at microwave or millimeter wave band frequencies.

BACKGROUND OF THE INVENTION

FIG. 4(a) shows a circuit of a prior art microwave switch. In FIG. 4(a), 1 is an RF input terminal and 2 and 3 are a first and a second RF terminal, respectively. A first and a second FET 6, 7, each having a gate terminal 4, are connected between the RF input terminal 1 and the RF output terminals 2, 3, respectively. Inductances 5 are connected in parallel with the FET 6 and the FET 7.

FIG. 4(b) shows an equivalent circuit of an FET when the FET is off and FIG. 4(c) shows an equivalent circuit when the FET is on.

This switch operates as follows. In order to connect an RF signal input from the input terminal 1 and to the first output terminal 2, a zero volt signal is applied to the gate terminal 4 of the FET 6 to turn off the FET 6. A voltage not exceeding the FET pinch-off voltage, for example, −5 V, is applied to the gate terminal 4 of the FET 7 to turn off the FET 7. Then, the FET 6 and the FET 7 are equivalent to the circuits of FIGS. 4(c) and 4(b) respectively. Since only a resistance appears between the terminals 1 and 2, the RF signal is transmitted from the terminal 1 to the terminal 2. On the other hand, a resonance circuit comprising the inductance 5 connected with the FET 7 and the capacitance of the FET 7 resonates between terminals 1 and 3 at a desired frequency, and the electrical state of the FET 7 appears as an infinite impedance. Therefore the RF signal is not transmitted from the terminal 1 to the terminal 3. In addition, when the voltages applied to the gate terminals 4 of FETs 6 and 7 are reversed, the RF signal is transmitted to the second output terminal 3.

FIG. 5 shows a prior art microwave switched-line type phase shifter. In FIG. 5, the same reference numerals denote the same elements as those shown in FIG. 4. Reference numerals 8 and 9 designate a third and a fourth FET, respectively. 10 and 11 are a first and a second transmission line, respectively.

This phase shifter operates as follows. When the FET 6 and the FET 7 are turned on and the FET 8 and the FET 9 are turned off by controlling the voltages applied to the gate terminals 4, the RF signal which is input from the input terminal 1 is output to the output terminal 2 through the first transmission line 10. On the contrary, when the FET 6 and the FET 7 are turned off, and the FET 8 and the FET 9 are turned on, the RF signal input from the input terminal 1 transmitted through the second transmission line 11. In these cases, since the transmission lines 10 and 11 have a predetermined difference in electrical length, the phase shift between the two on states can be varied.

FIG. 6 shows a prior art loaded line type phase shifter. In FIG. 6, the same reference numerals denote the same elements as those shown in FIGS. 4 and 5 and 12 is a third transmission line. This loaded line type phase shifter includes a one-quarter wavelength transmission line 12 and two series connection transmission lines and FETs. The parameters of the series connected pair of transmission lines and FETs (a pair 10 and 6, and another pair 11 and 7) are chosen so that the susceptance viewed from the main line 12 is =jB when the FETs 6 and 7 are on and +jB when the FETs 6 and 7 are off. Then, the susceptance value B is related to the phase shift by, $$B = \tan(A/2)$$

A = the phase shift Then, the length of the main line 12 is chosen to produce a predetermined difference between the phase of the input signal and that of the output signal of the main line 12.

In the above-described impedance control circuit used as a microwave switch, a switched-line type phase shifter, or a loaded-line type phase shifter, the circuit is controlled through the capacitance of an FET in its off state. However, this capacitance value of an FET varies to a large extent due to variations in the FET fabrication process, thereby varying the circuit characteristics to a great extent. FIGS. 7(b) and 7(c) show the transmission characteristics of the resonance circuit of FIG. 7(a) when the capacitance of the FET is 0.15 pF and 0.1 pF, respectively, with the inductance 5 being 2 nH. As is apparent from these figures, when the capacitance of the FET 5 when in the off state is 0.15 pF, the attenuation amount $S_{21}$ of the output terminal 2 viewed from the input terminal 1 is at a maximum at about 9 GHz, and when it is 0.15 pF, the attenuation amount $S_{21}$ is at a maximum at about 11 GHz. Thus, the resonance frequency at which the impedance becomes infinite varies to a great extent due to the variations in the characteristics of the FET 5.

SUMMARY OF THE INVENTION

It is an object of the present invention to provide microwave elements for controlling the capacitance of the FET in the off state, to achieve constant uniform circuit characteristics independent of variations in FET characteristics.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, a series connected diode and capacitance are connected in parallel between the source and the drain of an FET, and the bias voltage of the diode is controlled to adjust the capacitance between the source and the drain of FET when the FET is in the off state. Therefore, even when the capacitance of the FET in the off state varies due to the variations in FET characteristics, constant, uniform circuit characteristics can be obtained, and impedance control by the FET can be precisely achieved.

BRIEF DESCRIPTION OF THE DRAWINGS

FIGS. 7(a) to 7(c) are circuit and frequency response diagrams of a prior art microwave switch.

DETAILED DESCRIPTION OF THE PREFERRED EMBODIMENTS

An embodiment of the present invention will be described in detail with reference to the drawings.

Figure 1A:
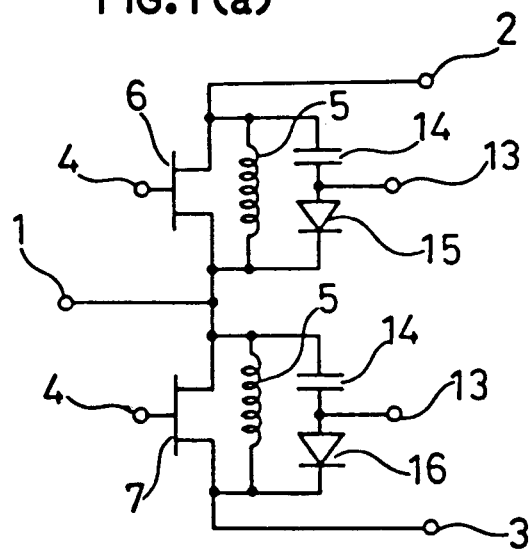
FIG. 1(a) is a diagram showing a circuit of a microwave switch according to a first embodiment of the present invention.

FIG. 1(a) is a diagram showing a circuit of a microwave switch according to a first embodiment of the present invention. In FIG. 1(a), 1 is an RF input terminal and 2 and 3 are a first and a second RF output terminal, respectively. A first and a second FET 6 and 7, each including a gate terminal 4, are connected between the RF input terminal 1 and the RF output terminals 2, 3, respectively. Inductances 5 are connected in parallel with the FETs 6 and 7, respectively. Serial connections of a capacitor 14 and a respective diode 15, 16 are connected in parallel with the FET 6 and FET 7, respectively.

Figure 1B:
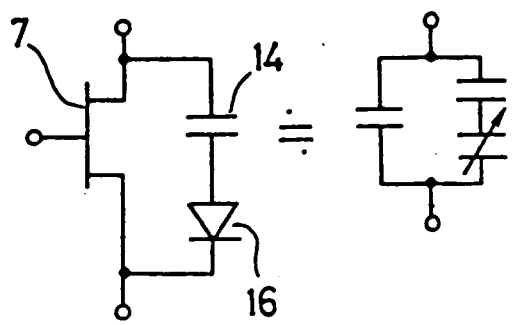
FIGS. 1(b) and 1(c) are diagrams showing an equivalent circuit of a portion of the microwave switch of FIG. 1(a) when the FET is off and on, respectively.
Figure 1C:
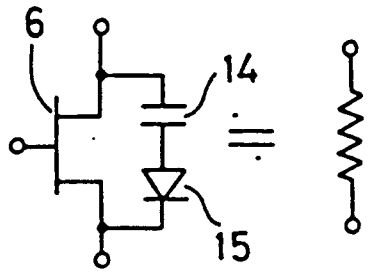

FIGS. 1(b) and 1(c) are diagrams showing an equivalent circuit of a portion of the microwave switch when the FET is off and on, respectively.

This microwave switch operates as follows. In order to connect an RF signal from the input terminal 1 to the output terminal 2, a zero volt signal is applied to the gate terminal 4 of the FET 6 to turn on the FET 6. A voltage not exceeding an FET pinch-off voltage, for example, −5 V, is applied to the gate terminal 4 of the FET 7 to turn off the FET 7. Then the FET 6 and FET 7 appear equivalent to the circuits of FIGS. 1(c) and 1(b), respectively. As in the prior art, since only a resistance is present between the terminals 1 and 2, the RF signal is transmitted from the input terminal 1 to the first output terminal 2. On the other hand, the path between the input terminal 1 and the second output terminal 3 includes the inductance 5 connected with the FET 7 and the capacitance of the FET 7 which resonate at a desired frequency. The electrical characteristic, therefore, appears to be an infinite impedance. Therefore, the RF signal is not transmitted from the input terminal 1 to the second output terminal 3.

When the capacitance of the FET in the off state varies because of fabrication process variations, a voltage is applied to the diode-bias terminal 13 of the diode 16 to change the capacitance of the FET. For example, in FIG. 1(b), when the FET is in the off state and the capacitance is 0.1 pF, the capacitance of the capacitor 5 pF and the capacitance of the diode can be varied from 0.05 pF to 0.1 pF by adjusting the bias applied to a diode. Therefore a capacitance from 0.15 pF to 0.198 pF can be obtained by use of this control circuit. Therefore, by varying the bias voltage applied to the diode, the capacitance of the FET in the off state can be made constant and elements having a uniform characteristics can be obtained.

In addition, when the voltages applied to the gate terminals 4 of the FETs 6 and 7 are reversed, the RF signal is transmitted to the second output terminal 3.

In the above-described embodiment, the capacitances of the diodes 15 and 16 are adjusted so that the FETs 6 and 7 resonate with respective inductances 5 when in the off state to make the impedance of the FET infinite at a desired frequency, whereby a switch with uniform characteristics is obtained.

From a different point of view, in this embodiment there is an advantage in that the capacitance of the diode can be varied by adjusting the bias voltage of the diode and therefore, microwave switches with the same circuit construction can be provided for operation at different frequencies.

Figure 2:
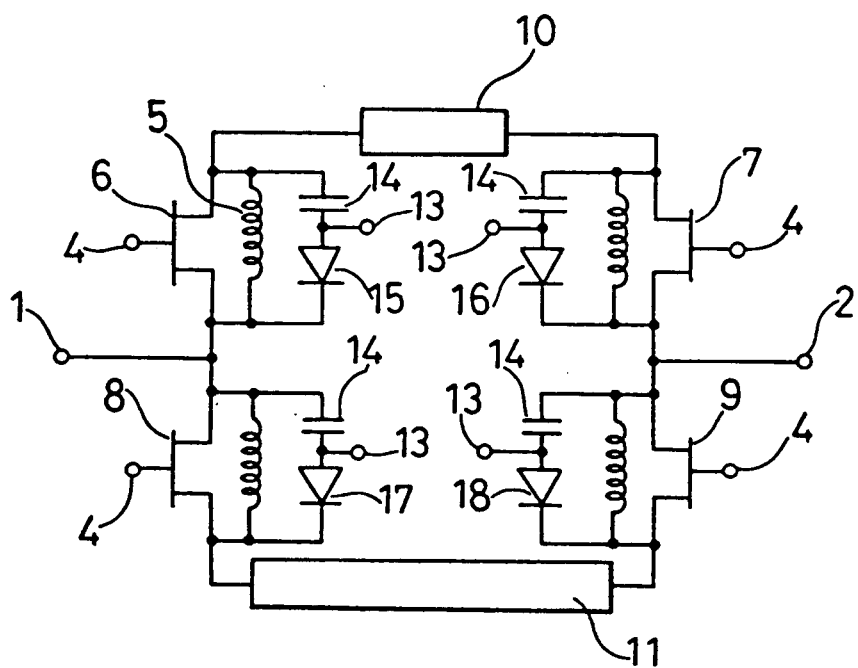
FIG. 2 is a diagram showing a circuit of a microwave switched-line type phase shifter according to a second embodiment of the present invention.

While in the above-described embodiment an impedance control circuit is used for a microwave switch, the circuit can also be used for a switched-line type phase shifter. FIG. 2 is a diagram showing a circuit of a microwave switched-line type phase shifter according to a second embodiment of the present invention. In FIG. 2, the same reference numerals denote the same elements as those shown in FIG. 1. 8 and 9 are a third and a fourth FET, respectively, and 10 and 11 are a first and a second transmission line, respectively. 17 and 18 are a third and a fourth diode, respectively.

This phase shifter operates as follows. When the FETs 6 and 7 are on and the FETs 8 and 9 are off, the RF signal is input from the input terminal 1 and is output to the first output terminal 2 through the first transmission line 10. On the contrary, when the FETs 6 and 7 are off and the FETs 8 and 9 are on, the RF signal is transmitted through the transmission line 11. In these cases, since the transmission lines 10 and 11 have different predetermined electrical lengths, the phase shift in each of the two states is different. As is the case with the switch in the above-described embodiment, even when the capacitance of the FET in the off state varies from a desired value, the effective capacitance can be adjusted by applying a voltage to the diode bias terminal 13 of the respective diodes, resulting in uniform element characteristics.

Figure 3:
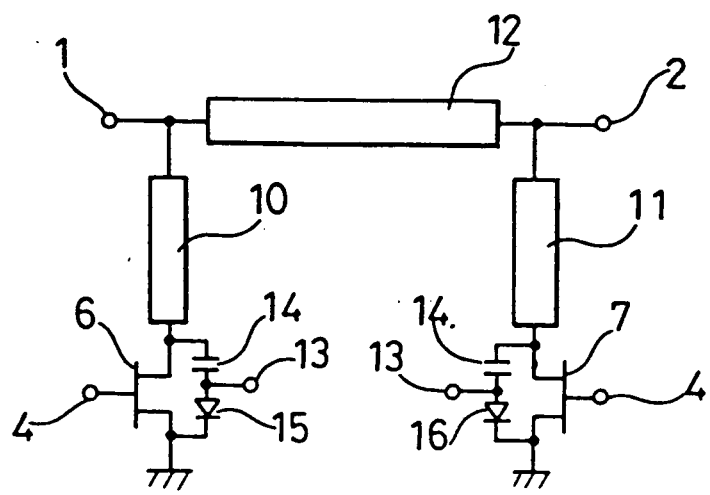
FIG. 3 is a diagram showing a circuit of a microwave loaded-line type phase shifter according to a third embodiment of the present invention.
Figure 4A:
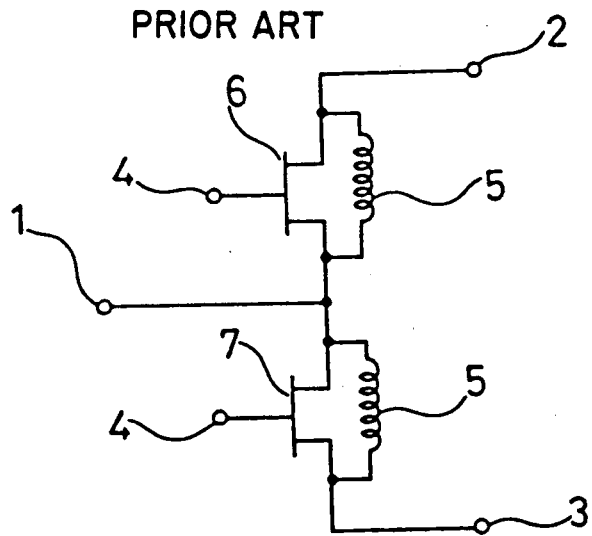
FIG. 4(a) is a diagram showing a circuit of a prior art microwave switch.
Figure 4B:
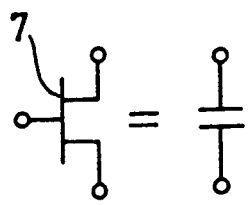
FIGS. 4(b) and 4(c) are diagrams showing an equivalent circuit of a porotion of the microwave switch of FIG. 4(a) when the FET is off and on, respectively.
Figure 4C:
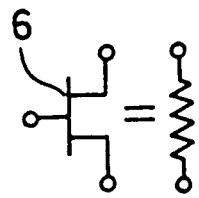
Figure 5:
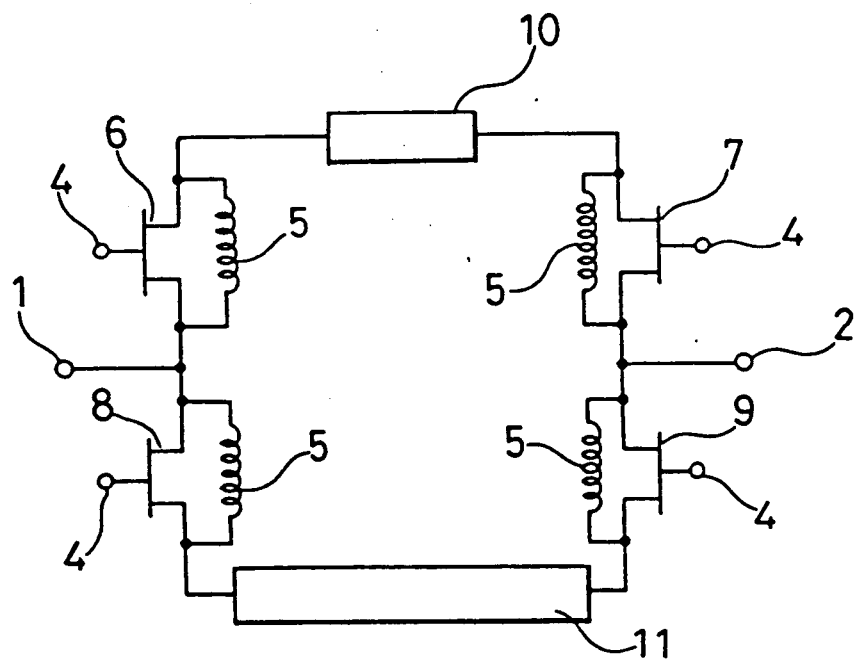
FIG. 5 is a diagram showing a circuit of a prior art microwave switched-line type phase shifter.
Figure 6:
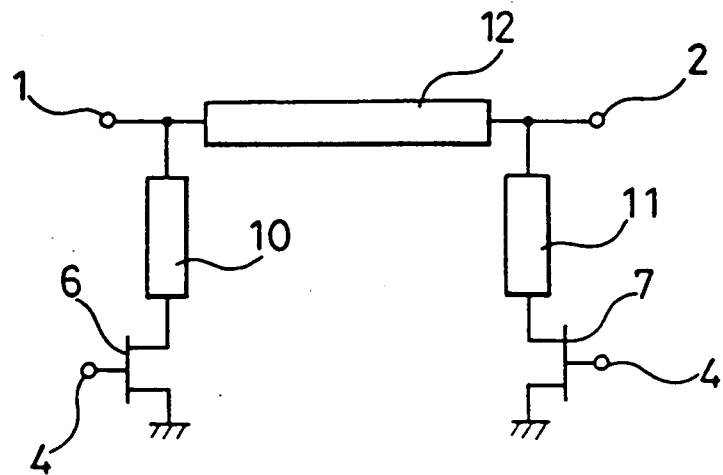
FIG. 6 is a diagram showing a circuit of a prior art microwave loaded-line type phase shifter.

FIG. 3 is a circuit construction of loaded-line type phase shifter according to a third embodiment of the present invention. In FIG. 3, the same reference numerals denote the same elements as those shown in FIGS. 1 and 2. 12 is a third transmission line. A loaded-line type phase shifter as this third embodiment operates in the same way as the described for other embodiments. The capacitance of the diode can be varied by varying the diode bias voltage just as in the switch of the first embodiment and the switched line type phase shifter of the second embodiment. Therefore, even when the characteristics of the FET vary because of production process variations, the capacitance between the source and drain of the FET in the off state is adjusted to a desired uniform value, and the element characteristics are greatly enhanced.

While in the above-described first, second, and third embodiments, a description is given of a switch and phase shifters, this invention can be applied not only to these devices but also to other devices using variable capacitances, e.g., a voltage-controlled oscillator.

As is evident from the foregoing description, according to the present invention the capacitance of a FET in the off state is controlled by a diode connected in parallel with the FET. Therefore, microwave elements with constant, uniform characteristics are obtained, and, furthermore, a microwave element with a particular circuit construction can be operated at different frequencies.

What is claimed is:

1. A microwave element comprising:
    field effect transistor having source, drain, and gate terminals;
    a series-connected diode and capacitor connected between the source and drain terminals; and
    means for applying a variable bias voltage to said diode to vary the capacitance of the diode for controlling the capacitance between said source and said drain of said transistor when the transistor is off.

2. A microwave switch comprising:
    first and second series-connected field effect transistors, each including a source terminal, a drain terminal, and a gate terminal, a source terminal and a drain terminal of the first and second transistors being connected together;
    first and second impedance control circuits, each circuit comprising a series-connected diode and capacitor, the first and second circuits being respectively connected between the source and drain terminals of the first and second transistors;
    means for applying variable bias voltages to each of said diodes to vary the capacitance of each of said diodes and the capacitance between the source and drain terminals of the respective transistors;
    an input terminal connected to the connection between said first and second transistors; and
    first and second output terminals at the respective drain and source terminals of said first and second transistors that are not connected together.

3. A microwave switched-line phase shifter comprising:
    first and second transmission lines having different electrical lengths, each transmission line having first and second ends;
    first and second field effect transistors, each having a source terminal, a drain terminal, and a gate terminal, one of the source terminals and the drain terminals of the first and second transistors being connected, respectively, to the first and second ends of the said first transmission line;
    third and fourth field effect transistors, each having a source terminal, a drain terminal, and a gate terminal, one of the source terminals and the drain terminals of the third and fourth transistors being connected, respectively, to the first and second ends of said second transmission line;
    first, second, third, and fourth impedance control circuits, each circuit comprising a series-connected diode and capacitor, connected respectively between the source and drain terminals of said first, second, third, and fourth transistors;
    means for applying variable bias voltages to each of said diodes to vary the capacitance of each of said diodes and the capacitances between the source and drain terminals of the respective transistors;
    an input terminal connected to a series connection of a source terminal and a drain terminal of the first and third transistors; and
    an output terminal connected to a series connection of a source terminal and a drain terminal of the second and fourth output transistors.

4. A microwave loaded-line phase shifter comprising:
    a principal transmission line having first and second ends;
    first and second loaded transmission lines of the same electrical length respectively connected to the first and second ends of said principal transmission line;
    first and second field effect transistors, each having a source terminal, a drain terminal, and a gate terminal, respectively connected between said first and second loaded transmission lines and ground;
    first and second impedance control circuits, each circuit comprising a series-connected diode and capacitor connected between the source terminal and the drain terminal of the respective first and second transistors; and
    means for applying a variable bias voltage to each of said diodes to vary the capacitance of each of said diodes and the capacitances between the source and drain terminals of the respective transistors.

* * * * *